United States Patent
Herr et al.

(10) Patent No.: US 11,933,069 B2
(45) Date of Patent: Mar. 19, 2024

(54) LOCKING ARRANGEMENT FOR A SWITCH CABINET

(71) Applicant: RITTAL GMBH & CO. KG, Herborn (DE)

(72) Inventors: Jacob Herr, Herborn (DE); Carsten Bäumer, Freudenberg (DE)

(73) Assignee: RITTAL GMBH & CO. KG (DE)

( * ) Notice: Subject to any disclaimer, the term of this patent is extended or adjusted under 35 U.S.C. 154(b) by 353 days.

(21) Appl. No.: 17/432,961

(22) PCT Filed: Feb. 13, 2020

(86) PCT No.: PCT/DE2020/100099
§ 371 (c)(1),
(2) Date: Aug. 23, 2021

(87) PCT Pub. No.: WO2020/173523
PCT Pub. Date: Sep. 3, 2020

(65) Prior Publication Data
US 2022/0159854 A1    May 19, 2022

(30) Foreign Application Priority Data
Feb. 25, 2019   (DE) ................. 10 2019 104 733.1

(51) Int. Cl.
*E05B 15/02*   (2006.01)
*E05B 9/08*    (2006.01)
*E05C 9/00*    (2006.01)
*H05K 5/02*    (2006.01)

(52) U.S. Cl.
CPC ............ *E05B 15/02* (2013.01); *E05B 9/08* (2013.01); *E05C 9/00* (2013.01); *H05K 5/0221* (2013.01)

(58) Field of Classification Search
CPC ...... E05B 15/00; E05B 15/02; E05B 15/0205; E05B 15/021; E05B 2015/0215;
(Continued)

(56) References Cited

U.S. PATENT DOCUMENTS

2009/0144939 A1* 6/2009 Ramsauer ............... E05B 15/02
                                                              292/336.3
2009/0179439 A1* 7/2009 Ramsauer ................. E05B 9/08
                                                              292/336.3
(Continued)

FOREIGN PATENT DOCUMENTS

| DE | 19853694 A1 | 5/1999 | |
|---|---|---|---|
| DE | 202006003304 U1 | 7/2007 | |
| DE | 202006003304 U1 * | 8/2007 | ............ E05B 15/02 |
| DE | 202007014083 U1 | 2/2009 | |

(Continued)

OTHER PUBLICATIONS

International Search Report (in English and German) and Written Opinion of the ISA (in German) issued in PCT/DE2020/100099, dated May 8, 2020; ISA/EP.

(Continued)

*Primary Examiner* — Nathan Cumar
(74) *Attorney, Agent, or Firm* — Harness, Dickey & Pierce, P.L.C.

(57) ABSTRACT

The invention relates to a locking arrangement for a switch cabinet, having a switch cabinet door which has on its inside a push-rod lock which projects through the switch cabinet door to the front side of the switch cabinet door via a coupling piece, wherein an actuating member is fixed to the front side via a handle adapter and is coupled to the coupling piece, for which purpose the switch cabinet door has at least one adapter plate, onto which the handle adapter is placed in a form-fitting manner via at least one aperture, the adapter (Continued)

plate having, on its side facing the actuating member, a fastening element, by means of which the actuating member is fixed to the adapter plate.

8 Claims, 4 Drawing Sheets

(58) Field of Classification Search
CPC ... E05B 9/00; E05B 9/08; E05B 9/082; E05C 9/00; H05K 5/00; H05K 5/0221
USPC .......................................................... 70/208
See application file for complete search history.

(56) References Cited

U.S. PATENT DOCUMENTS

| | | | |
|---|---|---|---|
| 2017/0122014 A1* | 5/2017 | Andrasfi | ............. E05B 15/0205 |
| 2020/0032561 A1 | 1/2020 | Bruck | |

FOREIGN PATENT DOCUMENTS

| | | | | |
|---|---|---|---|---|
| DE | 202007014083 U1 * | 3/2009 | ............. | E05B 15/02 |
| DE | 102017114094 A1 | 9/2018 | | |
| DE | 202018107399 U1 | 1/2019 | | |
| EP | 0446566 A1 | 9/1991 | | |

OTHER PUBLICATIONS

German International Preliminary Report on Patentability issued in PCT/DE2020/100099, dated Feb. 8, 2021.

* cited by examiner

LOCKING ARRANGEMENT FOR A SWITCH CABINET

CROSS-REFERENCE TO RELATED APPLICATIONS

This application is a U.S. National Phase Application under 35 U.S.C. 371 of International Application No. PCT/DE2020/100099, filed on Feb. 13, 2020, which claims the benefit of German Application No. 10 2019 104 733.1, filed on Feb. 25, 2019. The entire disclosures of the above applications are incorporated herein by reference.

BACKGROUND

This section provides background information related to the present disclosure which is not necessarily prior art.

Technical Field

The invention is based on a locking arrangement for a switch cabinet, the locking arrangement having a switch cabinet door with a push-rod lock arranged on the inside of the switch cabinet door. The push-rod lock extends from the inside via a coupling piece through the switch cabinet door to the opposite front side of the switch cabinet door, at which the coupling piece protrudes. Via the coupling piece, an actuating member at the front of the switch cabinet door can be coupled with the push-rod lock. Such a locking arrangement is known from DE 10 2017 114 094 A1.

Discussion

The known locking arrangements have the disadvantage that for the attachment of the actuating member to the front of the switch cabinet door, a flat support surface must be provided at the front for the secure fixing of the actuating member with respect to the coupling piece, for example to ensure an effective sealing of the actuating member with respect to the door to achieve a desired IP protection class. However, this in turn limits the design options with respect to the enclosure door, which is particularly disadvantageous in the field of IT enclosures.

SUMMARY

This section provides a general summary of the disclosure, and is not a comprehensive disclosure of its full scope or all of its features.

It is therefore one aspect of the invention to further develop a locking arrangement of the type described at the outset in such a way that it permits flexible coupling of an actuating member to the front of the enclosure door, irrespective of the geometry of the enclosure door.

Accordingly, it is provided that an actuating member is fixed to the front side via a handle adapter and is coupled to the coupling piece, for which purpose the switch cabinet door has at least one adapter plate onto which the handle adapter is placed in a form-fitting manner via at least one aperture. In this case, the adapter plate should have a fastening element on its side facing the actuating member, with which the actuating member is fixed to the adapter plate. The handle adapter is thereby preferably arranged between the actuating member and the switch cabinet door.

Since the mechanical fastening of the actuating member to the door is thus effected via the at least one adapter plate, which absorbs all the forces acting on the handle, and on which the handle adapter is placed in a form-fitting manner, the handle adapter can be designed essentially freely. On the one hand, it can thus accommodate a contour of the switch cabinet door, for example, in that the handle adapter has a contact side that is designed in such a way that the handle adapter rests positively on the door. On the other hand, the design of the handle adapter is limited only to the extent that it has the function of providing the flat support for mounting the actuator.

Accordingly, the handle adapter can serve to create a flat support surface and thus a flat mounting side for the actuating member independently of a geometry of the switch cabinet door, so that a high degree of design freedom is provided with regard to the geometry of the switch cabinet door.

The at least one adapter plate, preferably at least two adapter plates are provided, can be designed as a sleeve. The sleeve can have an external geometry in cross-section perpendicular to its longitudinal direction, which is constant along the longitudinal direction at least in sections and preferably over the entire length. The adapter plate, in particular the sleeve, can have a fastening means, such as at least one internal thread, on one of its two opposite end faces, via which the adapter plate can be fastened to the switch cabinet door. On the opposite end face, the adapter plate can have the fastening element with which the actuating element is fixed to the adapter plate. The fastening element may be designed to allow easy mounting and removal of the actuating member, for example according to the principle of a snap-on handle, as is known in principle from DE 10 2017 114 094 A1.

The fastening element can have at least one keyhole and the actuating member can have at least one mushroom head which engages in the adapter plate via the keyhole and engages behind the keyhole.

On its side facing the actuating member, the adapter plate can have a plug-in receptacle for a locking pin of the actuating member. The plug-in receptacle can be formed adjacent to the keyhole or in one piece with the keyhole, for example as a symmetrical keyhole with a central widened area for the insertion of a mushroom head, and with elongated holes extending therefrom in opposite directions, one of which serves to be engaged behind by the mushroom head in a locking position of the actuating member, and the other of which serves to receive a locking pin in order to prevent unintentional disassembly of the actuating member. Reference is also made in this respect to DE 10 2017 114 094 A1.

The handle adapter can have an elongated hole along which the coupling piece is guided through the handle adapter. In this case, the switch cabinet door can have two adapter plates and the handle adapter can have two apertures which are arranged opposite one another with respect to the elongated hole.

The switch cabinet door can have a further elongated hole along which the coupling piece is guided through the switch cabinet door, whereby the further elongated hole and the elongated hole are arranged offset to each other. The coupling piece can have a Z-edge between the elongated hole and the further elongated hole. The Z-edge can provide a horizontal offset of the coupling of the actuating member to the coupling piece.

The at least one adapter plate can be detachably connected to the switch cabinet door, in particular to a hollow profile of the switch cabinet door, preferably screwed thereto, and inserted from the inside of the switch cabinet door into a hollow profile of the switch cabinet door. The adapter plate can be connected to the switch cabinet door on an outer side of the hollow profile opposite the inner side.

The coupling piece can extend through a profile, preferably a hollow profile, of the switch cabinet door. The handle adapter can have a latching contour on a longitudinal edge with which it engages around a profile edge on the outside of the profile.

The handle adapter can be placed on an outer side of a profile, preferably on a hollow profile of the switch cabinet door, the outer side extending at an acute angle with respect to a switch cabinet door front side. In this case, the handle adapter can have a support side via which it rests on the outside and which extends at the same acute angle to a mounting side of the handle adapter via which the actuating member rests on the handle adapter, so that the mounting side extends parallel to the front side of the switch cabinet door.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Further details of the invention are explained with reference to the figures below. Thereby FIG. 1 shows a first embodiment of a locking arrangement according to the invention with the actuating member lifted off the handle adapter;

DETAILED DESCRIPTION

Example embodiments will now be described more fully with reference to the accompanying drawings.

Figure 1:
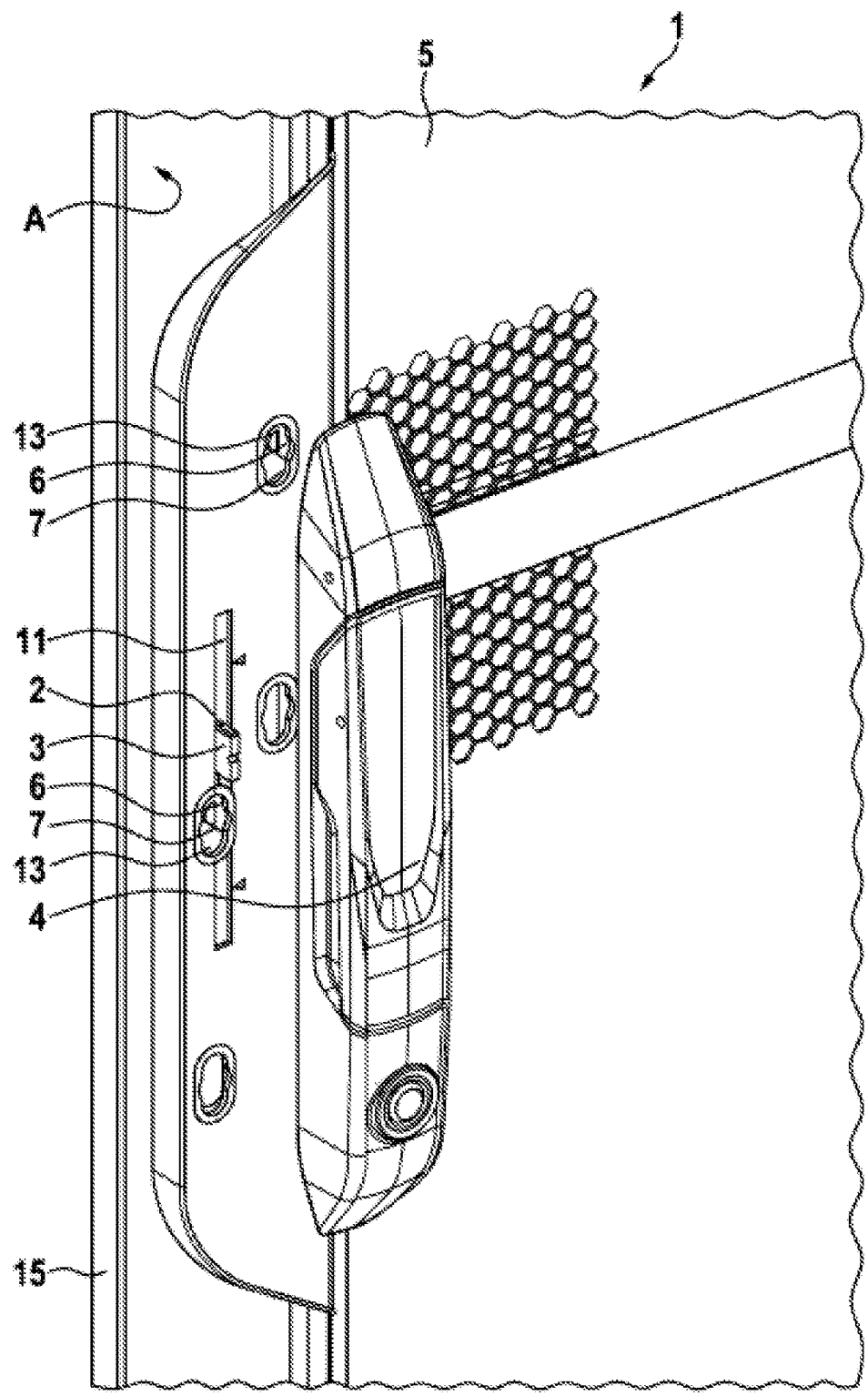

FIG. 1 shows an exemplary embodiment of a locking arrangement for a switch cabinet. This has a switch cabinet door 1 which has on its inside a push-rod lock 2 (see also FIG. 4) which projects through the switch cabinet door 1 via a coupling piece 3 on the front side of the switch cabinet door 1 shown. An actuating member 4 can be coupled to the push-rod lock via the coupling piece 3. The actuating member 4 is arranged lifted from a handle adapter 5. When the actuating member 4 is placed on the handle adapter, the coupling piece 3 couples with a coupling plate on the mounting side of the actuating member 4 facing the coupling piece 3. A suitable actuating member 4 is described in DE 10 2017 114 094 A1.

The switch cabinet door 1 further has two adapter plates 6, onto which a handle adapter 5 is positively fitted via an aperture 13 in each case. On its side facing the actuating member 4, the adapter plate 6 has a fastening element 7 with which the actuating member 4 is fixed to the adapter plate 6. The fastening element 7 is designed as a keyhole, in this case as a double keyhole with a central widening adjoined by an elongated hole on the opposite side. In this way, the adapter plates 6 or the fastening elements 7 can be used for both the left-hand stop and the right-hand stop of the switch cabinet door 1 and also serve to accommodate a locking pin of the actuator.

Figure 2:
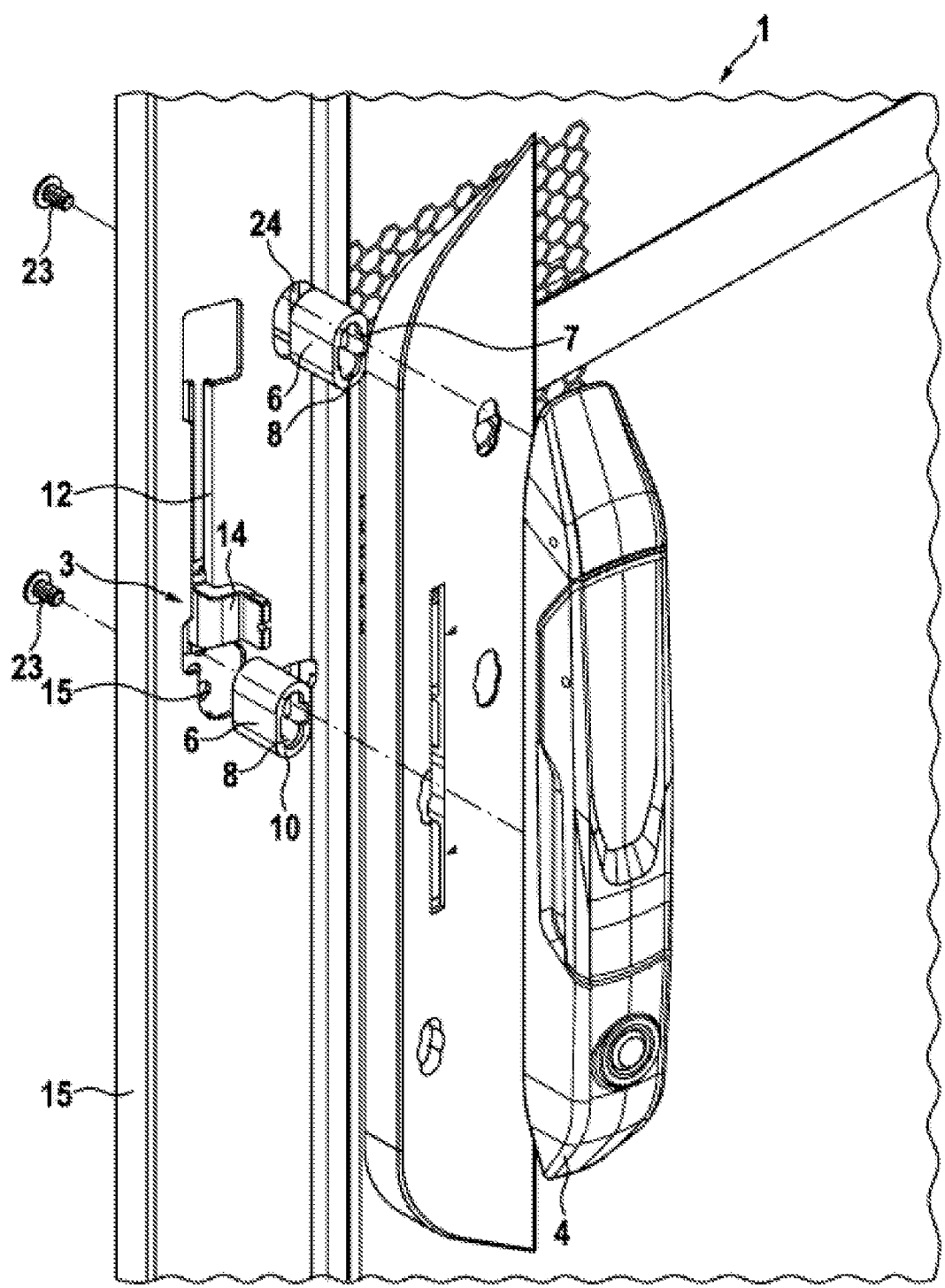
FIG. 2 shows an exploded view of the locking arrangement according to FIG. 1.

With reference to FIG. 2, it is shown that the switch cabinet door 1 has a hollow profile 15 on its vertical end face facing away from the hinge side of the switch cabinet door 1, into which the adapter plates 6 are inserted from the outside of the hollow profile 4 via a passage 24 into the hollow profile 15. One of the two passages 15 is moulded onto the end of a slotted hole 12. Along the elongated hole 12 the coupling piece 3, in particular a Z-edge of the coupling piece 3, is guided between a closed position and an open position of the drawer lock. From the inside of the hollow profile 15, the adapter plates 6 can be screwed to the hollow profile 15 via at least one screw 23 each.

Figure 3:
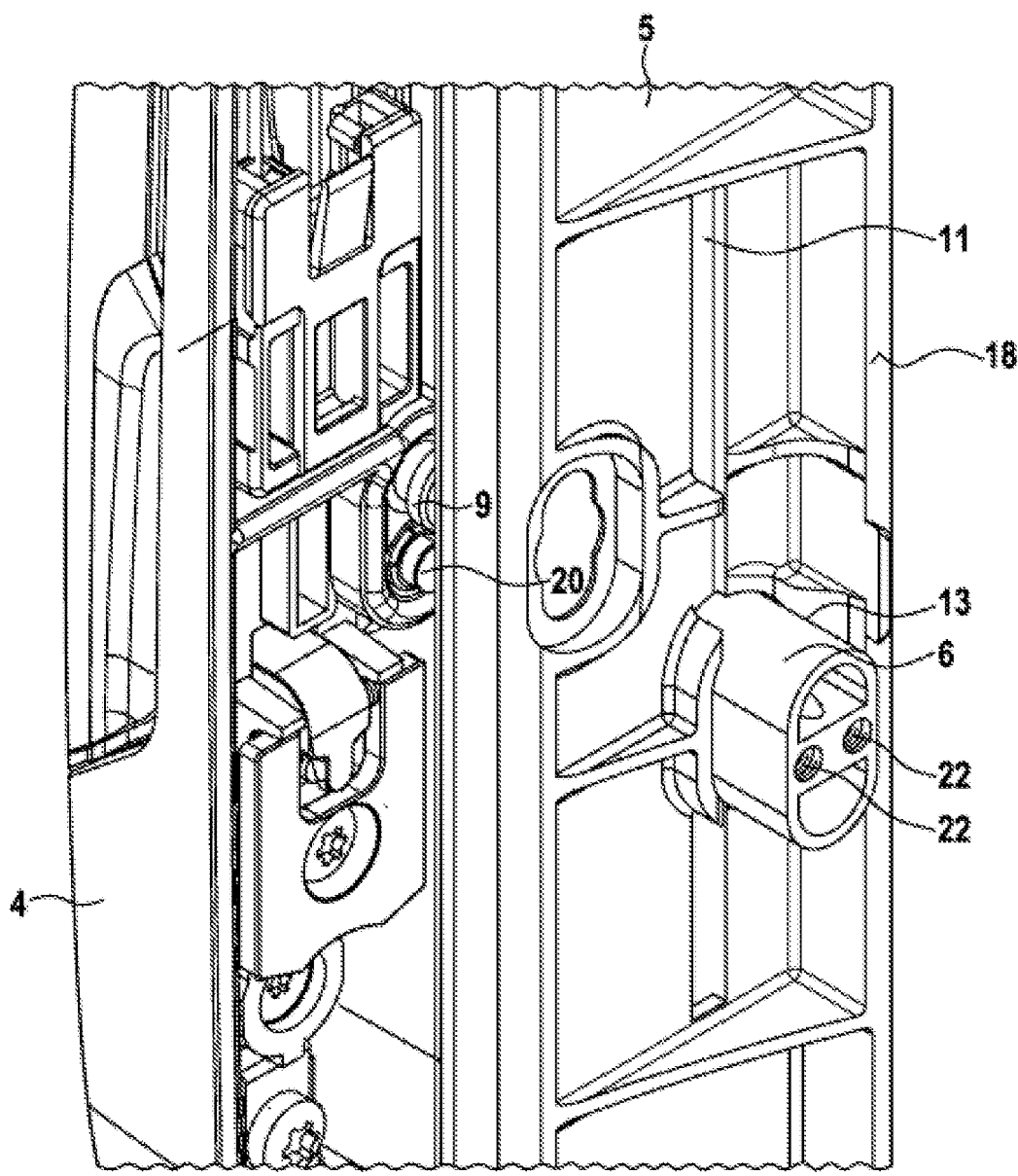
FIG. 3 shows a further embodiment of a locking arrangement according to the invention.

As shown with reference to FIG. 3, for this purpose the adapter plate 6 can have at least one internal thread 22 and in the present case two internal threads 22 on its side facing the front of the hollow profile 15. Furthermore, it can be seen in FIG. 3 that the actuating member 4 has, on the one hand, a mushroom head 9 on its side facing the handle adapter 5 and, associated with this, a locking pin 20. In order to receive the locking pin 20 in the correct position of the actuating member 4 in relation to the handle adapter 5, the adapter plate 6 can have a plug-in receptacle 10 for the locking pin 20 of the actuating member 4 on its side facing the actuating member 4; see FIG. 1. The plug-in receptacle 10 is part of the symmetrically formed keyhole 8.

Figure 4:
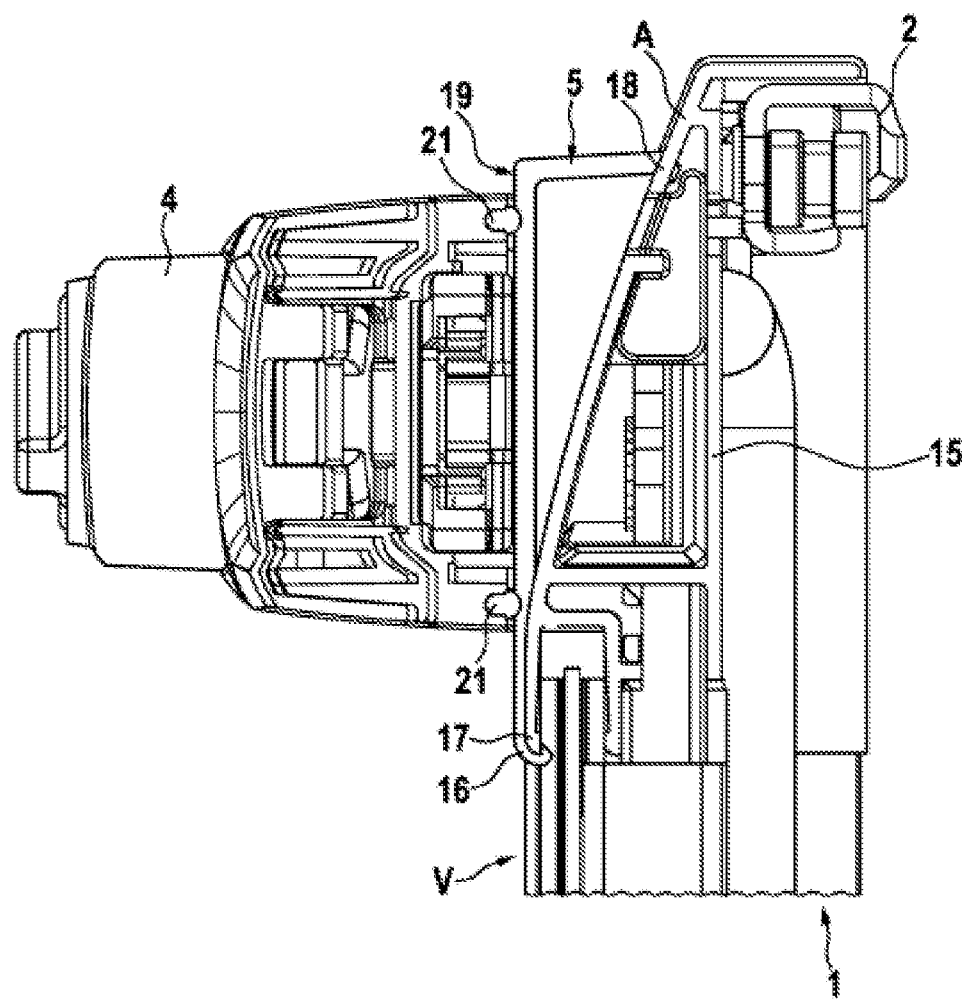
FIG. 4 shows a horizontal cross-section through a further embodiment of a locking arrangement according to the invention.

With reference to FIG. 4, it can be seen that the handle adapter 5 has a latching contour 16 on one longitudinal edge, with which it engages around a profile edge 17 on the outer side A of the hollow profile 15. Furthermore, the handle adapter 5 is placed on an outer side A of the hollow profile 15 of the switch cabinet door 1. The outer side A extends at an acute angle with respect to a front side V of the switch cabinet door. The handle adapter 5 has a support side 18 (see also FIG. 3), via which it rests on the outer side A and which extends at the same acute angle to a mounting side 19 of the handle adapter 5. Via the mounting side 19, the actuating member 4 is placed on the handle adapter 5 so that the mounting side 19 extends parallel to the front of the switch cabinet door.

The features of the invention disclosed in the foregoing description, in the drawings as well as in the claims may be essential for the realisation of the invention both individually and in any combination.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A locking arrangement for a switch cabinet, the locking arrangement having a switch cabinet door which has on its inside a push-rod lock which projects through the switch cabinet door to a front side of the switch cabinet door via a coupling piece, an actuating member, a handle adapter arranged between the actuating member and the switch cabinet door and forming a flat support for the actuating member, and is coupled to the coupling piece, the actuating member being fixed to the front side of the door by the handle adapter, the switch cabinet door having at least one adapter plate onto which the handle adapter is placed in a form-fitting manner via at least one aperture, the adapter plate having, on its side facing the actuating member, a fastening element by means of which the actuating member is fixed to the adapter plate; and wherein the handle adapter has an elongated hole along which the coupling piece is guided through the handle adapter, the enclosure door having two adapter plates and the handle adapter having two apertures arranged opposite each other with respect to the elongated hole.

2. The locking arrangement according to claim 1, wherein the fastening element has at least one keyhole and the actuating member has at least one mushroom head which engages in the adapter plate via the keyhole and engages behind the keyhole.

3. The locking arrangement according to claim 1, in which the adapter plate has, on its side facing the actuating member, a plug-in receptacle for a locking pin of the actuating member.

4. The locking arrangement according to claim 3, in which the plug-in receptacle is formed adjacent to the keyhole or integrally with the keyhole.

5. The locking arrangement according to claim 1, in which the switch cabinet door has a further elongated hole along which the coupling piece is guided through the switch cabinet door, the further elongated hole and the elongated hole being arranged offset with respect to one another and the coupling piece having a Z-edge between the elongated hole and the further elongated hole.

6. The locking arrangement according to claim 1, in which the at least one adapter plate is detachably connected to the switch cabinet door, preferably screwed, and is inserted from the inside of the switch cabinet door into a hollow profile of the switch cabinet door.

7. The locking arrangement according to claim 1, in which the coupling piece extends through a profile, preferably a hollow profile, of the switch cabinet door and the handle adapter has a latching contour on a longitudinal edge, with which it engages around a profile edge on the outside of the profile.

8. A locking arrangement for a switch cabinet, the locking arrangement having a switch cabinet door which has on its inside a push-rod lock which projects through the switch cabinet door to a front side of the switch cabinet door via a coupling piece, an actuating member, a handle adapter arranged between the actuating member and the switch cabinet door and forming a flat support for the actuating member, and is coupled to the coupling piece, the actuating member being fixed to the front side of the door by the handle adapter, the switch cabinet door having at least one adapter plate onto which the handle adapter is placed in a form-fitting manner via at least one aperture, the adapter plate having, on its side facing the actuating member, a fastening element by means of which the actuating member is fixed to the adapter plate, in which the handle adapter is placed on an outer side of a profile, preferably a hollow profile of the switch cabinet door, the outer side extending at an acute angle with respect to a switch cabinet door front side, and wherein the handle adapter has a support side via which it rests on the outer side, which extends at the same acute angle to a mounting side of the handle adapter via which the actuating member rests on the handle adapter, so that the mounting side extends parallel to the switch cabinet door front side.

\* \* \* \* \*